(12) United States Patent
Faes et al.

(10) Patent No.: US 11,946,822 B2
(45) Date of Patent: Apr. 2, 2024

(54) SEMICONDUCTOR TRANSDUCER DEVICE WITH MULTILAYER DIAPHRAGM AND METHOD OF MANUFACTURING A SEMICONDUCTOR TRANSDUCER DEVICE WITH MULTILAYER DIAPHRAGM

(71) Applicant: Sciosense B.V., AE Eindhoven (NL)

(72) Inventors: Alessandro Faes, Premstätten (AT); Jörg Siegert, Graz (AT); Willem Frederik Adrianus Besling, JN Eindhoven (NL); Remco Henricus Wilhelmus Pijnenburg, AE Hoogeloon (NL)

(73) Assignee: Sciosense B.V., AE Eindhoven (NL)

( * ) Notice: Subject to any disclaimer, the term of this patent is extended or adjusted under 35 U.S.C. 154(b) by 435 days.

(21) Appl. No.: 17/290,140

(22) PCT Filed: Oct. 16, 2019

(86) PCT No.: PCT/EP2019/078113
§ 371 (c)(1),
(2) Date: Apr. 29, 2021

(87) PCT Pub. No.: WO2020/094351
PCT Pub. Date: May 14, 2020

(65) Prior Publication Data
US 2021/0356342 A1 Nov. 18, 2021

(30) Foreign Application Priority Data
Nov. 7, 2018 (EP) ..................................... 18205001

(51) Int. Cl.
*G01L 9/00* (2006.01)
*B81B 3/00* (2006.01)
*B81C 1/00* (2006.01)

(52) U.S. Cl.
CPC .......... *G01L 9/0073* (2013.01); *B81B 3/0021* (2013.01); *B81C 1/00595* (2013.01);
(Continued)

(58) Field of Classification Search
CPC ........ B81C 1/00246; B81C 2201/0167; B81C 1/00476; B81C 1/00801;
(Continued)

(56) References Cited

U.S. PATENT DOCUMENTS 5,573,679 A * 11/1996 Mitchell ............. B81C 1/00595
216/2
6,012,336 A 1/2000 Eaton et al.
(Continued)

FOREIGN PATENT DOCUMENTS

| CN | 103257005 A | 8/2013 |
|---|---|---|
| CN | 105236347 A | 1/2016 |
| CN | 105444931 A | 3/2016 |

*Primary Examiner* — Mohammed R Alam
(74) *Attorney, Agent, or Firm* — Slater Matsil, LLP

(57) ABSTRACT

In an embodiment a semiconductor transducer device includes a semiconductor body and a diaphragm having a first layer and a second layer, wherein a main extension plane of the diaphragm is arranged parallel to a surface of the semiconductor body, wherein the diaphragm is suspended at a distance from the semiconductor body in a direction perpendicular to the main extension plane of the diaphragm, wherein the second layer comprises titanium and/or titanium nitride, wherein the first layer comprises a material that is resistant to an etchant comprising fluorine or a fluorine compound, and wherein the second layer is arranged between the semiconductor body and the first layer.

20 Claims, 1 Drawing Sheet

(52) U.S. Cl.
CPC .... *G01L 9/0042* (2013.01); *B81B 2201/0264* (2013.01); *B81B 2203/0127* (2013.01); *B81B 2207/015* (2013.01); *B81C 2201/0109* (2013.01); *B81C 2201/0133* (2013.01); *B81C 2201/014* (2013.01)

(58) Field of Classification Search
CPC ...... B81C 2203/0714; B81C 2201/014; B81B 3/0072; B81B 2203/04; B81B 2207/015; B81B 2201/0257; H04R 19/005; H04R 19/04; H04R 31/00
See application file for complete search history.

(56) References Cited

U.S. PATENT DOCUMENTS

| | | |
|---|---|---|
| 8,071,486 B2 | 12/2011 | Fortin et al. |
| 2008/0128841 A1* | 6/2008 | Fujimori ............... B81B 7/0058 257/E29.324 |
| 2013/0161702 A1* | 6/2013 | Chen .................. B81C 1/00246 257/E27.006 |
| 2014/0080227 A1* | 3/2014 | Tomioka ........... H01L 21/31105 438/3 |
| 2016/0023893 A1 | 1/2016 | Besling et al. |

* cited by examiner

SEMICONDUCTOR TRANSDUCER DEVICE WITH MULTILAYER DIAPHRAGM AND METHOD OF MANUFACTURING A SEMICONDUCTOR TRANSDUCER DEVICE WITH MULTILAYER DIAPHRAGM

This patent application is a national phase filing under section 371 of PCT/EP2019/078113, filed Oct. 16, 2019, which claims the priority of European patent application 18205001.3, filed Nov. 7, 2018, each of which is incorporated herein by reference in its entirety.

TECHNICAL FIELD

A diaphragm of a semiconductor transducer device, like a pressure sensor, can comprise a sequence of layers including a main metal layer. The diaphragm, for example a MEMS membrane, is applied on a sacrificial layer. A layer of TiN/Ti or TiN may be arranged between the main metal layer and the sacrificial layer to facilitate adhesion and to provide a diffusion barrier and stress compensation, and a layer of TiN may also be arranged on the main metal layer. The sacrificial layer is afterwards removed to release the diaphragm, in particular by hydrofluoric, HF, vapor etching. A chemical reaction of HF vapor with Ti may produce residues such as Ti fluorides, which may adversely affect the properties of the diaphragm.

BACKGROUND

US Patent Publication No. 2016/0023893 A1 discloses a suspended membrane for a capacitive pressure sensor, which comprises depositing a first electrically conductive material above a sacrificial layer and within a boundary trench, removing at least a portion of uneven topography of the first electrically conductive material, depositing a second electrically conductive material extending beyond the boundary trench, and removing the sacrificial layer through etch openings, thus forming a cavity below the second electrically conductive material.

U.S. Pat. No. 8,071,486 B2 discloses a method of removing residues resulting from processing in HF vapor, wherein the fabricated device is exposed to dry water vapor for a period of time sufficient to dissolve the residues in the dry water vapor.

SUMMARY

Embodiments provide an improved concept of a semiconductor transducer device with a multilayer diaphragm and a method of manufacturing a semiconductor transducer device with multilayer diaphragm that is especially suitable for HF vapor etch release.

The improved concept is based on the idea of providing a semiconductor transducer device having a diaphragm that comprises an additional layer that is resistant to fluorine-based etchants, e.g. hydrofluoric acid, such that the production of residues during an etching process is prevented. In order to not complicate the manufacturing process, the additional layer is required to maintain the CMOS compatibility of the entire manufacturing process. Furthermore, in order not to deteriorate the performance of the finalized transducer device, e.g. in terms of sensitivity and/or noise behavior, the additional layer is required only insignificantly, if at all, modify the mechanical properties of the diaphragm. The additional layer of the diaphragm according to the improved concept leads to the fact that the overall manufacturing process is kept simple in a fashion that a cleaning step for removing residues during or after a fluorine-based etching process is no longer necessary, while at the same time the robustness and the yield of the production is significantly increased. Notably, the improved concept allows for a release of the diaphragm without forming residues, such as titanium fluoride, that may negatively impact the behavior of the finalized device, for example by deteriorating mechanical properties of the diaphragm of the transducer.

A semiconductor transducer device according to the improved concept comprises a semiconductor body and a diaphragm, such as a MEMS membrane, having a first layer and a second layer. The diaphragm may be structured, for example it is perforated. A main extension plane of the diaphragm is arranged parallel to a surface of the semiconductor body in a fashion that the diaphragm is suspended at a distance from the semiconductor body in a vertical direction, which is perpendicular to the main extension plane of the diaphragm. The distance may be smaller than 10 µm, for example in the order of 1-3 µm.

The second layer comprises titanium, Ti, and/or titanium nitride, TiN, while the first layer comprises a material that is resistant to an etchant comprising fluorine or a fluorine compound. Resistant in this context means that the etch rate of the first layer is significantly lower than that of the second layer of the diaphragm. In particular, the etch rate of the material of the first layer is lower than that of the second layer regarding an etchant comprising fluorine or a fluorine compound. The second layer is arranged between the semiconductor body and the first layer.

The first layer of the diaphragm may be referred to as a protection layer that is arranged in contact with the second layer at a greater distance from the semiconductor body than the second layer. Hence, the first layer may be regarded as being arranged on a surface of the second layer facing away from the semiconductor body. Diaphragms of conventional transducers comprise a second layer of a material comprising Ti, e.g. TiN, as a diffusion barrier and for the purpose of stress compensation. In contrast to the second layer, which due to its Ti-based material may react with a fluorine-based etchant, e.g. HF, to form undesired residues, the first layer according to the improved concept is of a material that is resistant to said etchant. In order not to significantly deteriorate the mechanical properties of the diaphragm, i.e. in order to maintain a certain stress and stress gradient, the first layer is deposited with a thickness smaller than 200 nm, for example in the range of 40-100 nm, which amounts to about 10% of a total thickness of the diaphragm.

In order to improve adhesion between the different layers, surfaces of the layers may be processed after deposition such that a roughness of said surfaces is decreased. For example, a chemical-mechanical polishing, CMP, process may be employed to achieve said improved adhesion.

The semiconductor body may comprise active circuitry of an application-specific integrated circuit, ASIC, which is arranged on or within a substrate, such as a silicon substrate.

In some embodiments of the semiconductor transducer device, the first layer is a material selected from the group consisting of tungsten, W, aluminum, Al, aluminum oxide, $Al_2O_3$, silicon carbide, SiC, and silicon germanium, SiGe.

A suitable choice for the material of the first layer is for example tungsten as it is compatible with CMOS fabrication processes and fulfills the requirement of being resistant to fluorine-based etching steps, such as a vapor-phase HF, vHF, etch.

In some embodiments, the diaphragm further comprises a third layer that is in contact with the second layer and is arranged at a smaller distance from the semiconductor body than the second layer.

Like the first layer being arranged on the second layer and hence covering its surface facing away from the semiconductor body, a third layer arranged in contact with the second layer protects its surface facing the semiconductor body and hence further aids at reducing residues during a vHF etch. Alternatively or in addition, the third layer may be regarded as the main layer of the diaphragm. The main layer of a diaphragm may for example constitute a top electrode of a semiconductor transducer that is configured as a capacitive transducer. Top electrode in this context refers to the electrode of a capacitive transducer that is arranged at a larger distance from the semiconductor body than the other electrode, which may in turn be referred to as bottom electrode.

In some further embodiments, the third layer comprises a metal.

Like for the first layer, suitable materials of the third layer that are compatible with CMOS processing include W, Al, $Al_2O_3$, SiC and SiGe. In case of the third layer being configured as a top electrode, a metallic material provides the required electrical conductance. For example, in order to keep the bill of materials short and hence the manufacturing process as simple as possible while maintaining full CMOS compatibility, both the first and the third layer consist of or comprise tungsten, a material with reasonably high mechanical and electrical properties and with the required HF resistance.

In some further embodiments, the diaphragm further comprises a fourth layer that comprises Ti and/or TiN, is in contact with the third layer and is arranged at a smaller distance from the semiconductor body than the third layer.

Conventional transducers are fabricated according to a process, in which the suspension of the diaphragm is realized by means of removing a sacrificial layer arranged in between the semiconductor body and the diaphragm. A common choice for the layer of the diaphragm arranged closest to the semiconductor body is a Ti-based material. Compared to for example tungsten that is characterized by a poor adhesion to the sacrificial layer, which typically comprises silicon or silicon dioxide, Ti and TiN are characterized by a significantly larger adhesion to such a sacrificial layer. Hence, providing said fourth layer facilitates the fabrication process. The choice of Ti and/or TiN for the fourth layer again ensures a short bill of materials as this choice corresponds to the material of the second layer.

In some embodiments, the semiconductor body further comprises an integrated circuit.

The transducer device may comprise an ASIC arranged on or within the semiconductor body for providing a readout of a deflection of the diaphragm, for example due to a pressure change. The readout may for example be based on a measurement of a capacitance of the transducer if the transducer device is a capacitive transducer, for instance.

In some embodiments, the semiconductor transducer further comprises an electrode layer arranged between the semiconductor body and the diaphragm, vias interconnecting the electrode layer and the semiconductor body and further vias interconnecting the diaphragm and the semiconductor body.

In these embodiments, an electrode layer made of a metal is arranged between the semiconductor body and the diaphragm at a distance from the diaphragm, for example the electrode layer is in contact with the semiconductor body. With the electrode layer forming a structured bottom electrode of the transducer, for example, enables determining a deflection of the diaphragm via a measurement of the capacitance of a capacitor formed between the top electrode, which may be a layer of the diaphragm, and the bottom electrode. Vias, such as through-substrate-vias, TSV, may provide the electric interconnection between the two electrodes and active circuitry of the semiconductor body.

In some further embodiments, a cover layer is arranged between the semiconductor body and the electrode layer.

In order to achieve electric insulation of the electrode layer from active circuitry of the semiconductor body, for example, a cover layer may be utilized. The cover layer may be a dielectric, such as silicon dioxide, $SiO_2$.

In some embodiments, the transducer device further comprises an etch stop layer, ESL, arranged between the semiconductor body and the diaphragm.

As the suspended diaphragm is conventionally realized by means of removing a sacrificial material in between the diaphragm and the semiconductor body, an etch stop layer may be employed in order to have a controlled ending point of the vHF etch used for removing the sacrificial material. Hence, the etch stop layer is configured to prevent overetching during the fabrication process of the transducer device. Also, on the finalized transducer device the ESL may serve as protective layer for underlying active circuitry of the semiconductor body and/or a bottom electrode formed on top of or above the semiconductor body. The etch stop layer is of a material that has a significantly lower etch rate than the sacrificial material regarding a fluorine-based etchant. The material of the ESL is a semiconductor material, such as silicon carbide, or of a dielectric, such as silicon nitride, e.g. silicon-rich silicon nitride, for instance.

The aforementioned object is further solved by a pressure sensor comprising a semiconductor transducer device according to one of the embodiments described above.

The pressure sensor may be configured to detect static pressure changes or dynamic pressure changes, such as pressure waves, e.g. sound waves in the acoustic frequency band. To this end, the pressure sensor may either consist of the semiconductor transducer device or may comprise further components, such as circuit components, a printed circuit board and/or a housing.

The aforementioned object is further solved by a mobile device comprising a pressure sensor with a semiconductor transducer device according to one of the embodiments described above.

Applications of the described semiconductor transducer device include compact and high-sensitivity pressure sensors or microphones that are, for example, employed in smartwatches, smartphones and tablet computers, in which the transducer device is configured to omnidirectionally detect static or dynamic pressure changes in an environment of the mobile device, for instance.

The aforementioned object is further solved by a method of producing a semiconductor transducer device. The method comprises providing a semiconductor body and forming a sacrificial layer on or above a surface of the semiconductor body. The method further comprises applying a diaphragm on the sacrificial layer and removing the sacrificial layer. Applying the diaphragm according to the improved concept comprises applying, patterning and structuring a first layer and a second layer, wherein applying the first layer comprises applying a material that is resistant to an etchant comprising fluorine or a fluorine compound.

Removing the sacrificial layer comprises introducing an etchant comprising fluorine or a fluorine compound into openings of the diaphragm.

Further embodiments of the method become apparent to the skilled reader from the embodiments of the semiconductor transducer device described above.

BRIEF DESCRIPTION OF THE DRAWINGS

The following description of figures of exemplary embodiments may further illustrate and explain aspects of the improved concept. Elements of the semiconductor transducer device with the same structure and the same effect, respectively, appear with equivalent reference symbols. Insofar as elements of the semiconductor transducer device correspond to one another in terms of their function in different figures, the description thereof is not repeated for each of the following figures.

DETAILED DESCRIPTION OF ILLUSTRATIVE EMBODIMENTS

Figure 1:
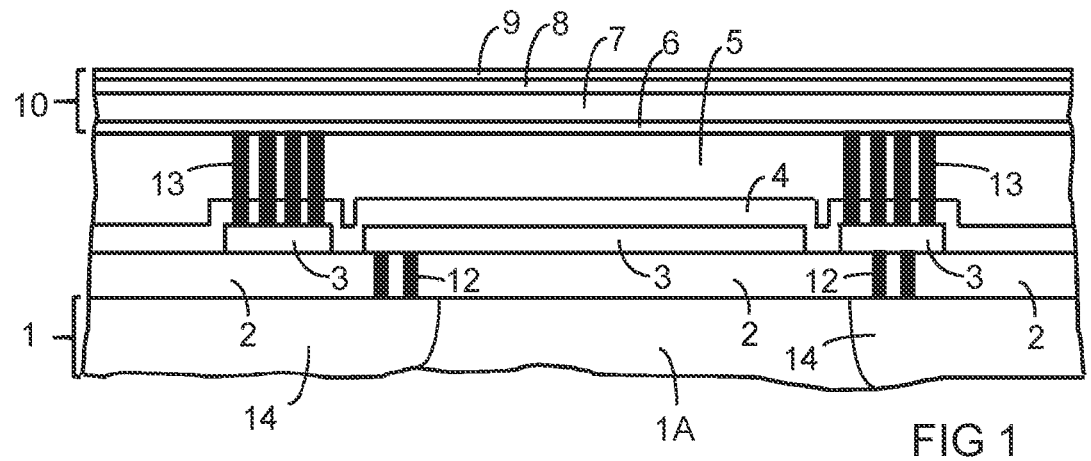
FIG. 1 shows a cross section of an intermediate product of a semiconductor transducer device after arrangement of a diaphragm.

FIG. 1 is a cross section of an intermediate product of a semiconductor transducer device, which may for example be employed in a pressure sensor. The semiconductor transducer device in this embodiment comprises a semiconductor body 1 comprising a substrate 1A, which may be silicon, for instance. The semiconductor body 1 may also include an integrated circuit 14, which may in particular be a CMOS circuit with active and passive circuitry. Such integrated circuits are known per se, and details of the integrated circuit 14, which depend on an individual application, are not shown in the figures. The integrated circuit 14 may especially be provided for an evaluation of signals from the transducer, such as a capacitance of the transducer.

A cover layer 2, which may include a wiring embedded in an inter-metal dielectric layer and/or a passivation, for instance, is applied on a surface of the semiconductor body 1. The inter-metal dielectric layer may comprise silicon dioxide, and the passivation may comprise a combination of silicon dioxide and silicon nitride, for instance. The part of the semiconductor transducer device that includes the semiconductor body 1 and the cover layer 2 may be similar to a conventional semiconductor device with an integrated circuit. The semiconductor transducer device differs from such a semiconductor device by an arrangement of transducer elements on a surface of the cover layer 2 facing away from the semiconductor body 1.

An electrode layer 3 may be arranged on the surface of the cover layer 2 and patterned and structured, for example via lithography and etching, in order to form a first electrode of a transducer, especially a capacitive transducer, for instance. The first electrode of such a transducer may be referred to as the bottom electrode. An etch stop layer 4 is arranged on a surface of the structured electrode layer 3 facing away from the semiconductor body 1. A sacrificial layer 5 is arranged on a surface of the etch stop layer 4 facing away from the semiconductor body 1. The etch stop layer 4 is made of a material with a significantly lower etch rate regarding a fluorine-based etchant compared to a material of the sacrificial layer 5. For example, the etch stop layer 4 comprises silicon nitride, such as silicon-rich silicon nitride, while the sacrificial layer comprises silicon or silicon dioxide.

The diaphragm 10 is arranged on a surface the sacrificial layer 5 facing away from the semiconductor body 1. The diaphragm 10 comprises a sequence of layers and may particularly include a first layer 9, a second layer 8, a third layer 7 and a fourth layer 6. The fourth layer 6 may be provided as a barrier layer and/or may facilitate the arrangement of the diaphragm 10 on the sacrificial layer 5. A material of the fourth layer 6 may be characterized by a larger adhesion to the sacrificial layer 5 compared to a material of the third layer 7. The fourth layer 6 may for example comprise titanium, titanium nitride, TiN, or a combination of titanium and TiN.

The third layer 7 of the diaphragm 10 may comprise a metal, which may e.g. be tungsten. The third layer 7 may be a uniform or homogeneous layer or a sequence of at least two individual layers of different materials. The third layer 7 may be referred to as the main layer of the diaphragm 10, for example constituting an upper electrode of a capacitive transducer device. A second layer 8 is arranged on the third layer 7 for stress compensation. Like the fourth layer 6, the second layer 8 comprises titanium, TiN or a combination of titanium and TiN and may be configured as a barrier layer as a diffusion barrier and/or for stress compensation, for example.

A first layer 9 is arranged as the layer of the diaphragm 10 being arranged at the largest distance from the semiconductor body 1. The first layer 9 comprises a material that is resistant to an etchant comprising fluorine or a fluorine compound like hydrofluoric, HF, acid. Therefore, the first layer 9 may be referred to as a protection layer. A suitable material choice is tungsten, for example. Other suitable materials of the first layer 9 include aluminum, aluminum oxide, silicon carbide or silicon-germanium, for example.

Vertical electric interconnections 12 may be provided to connect the electrode layer 3 with terminals of circuitry of the semiconductor body 1. For example, these interconnections are realized by vias, such as through-substrate-vias, TSV. Further vertical electric interconnections 13 may be provided by further vias to interconnect the diaphragm 10, e.g. a top electrode formed by the third layer 7, with further terminals of circuitry of the semiconductor body 1.

Figure 2:
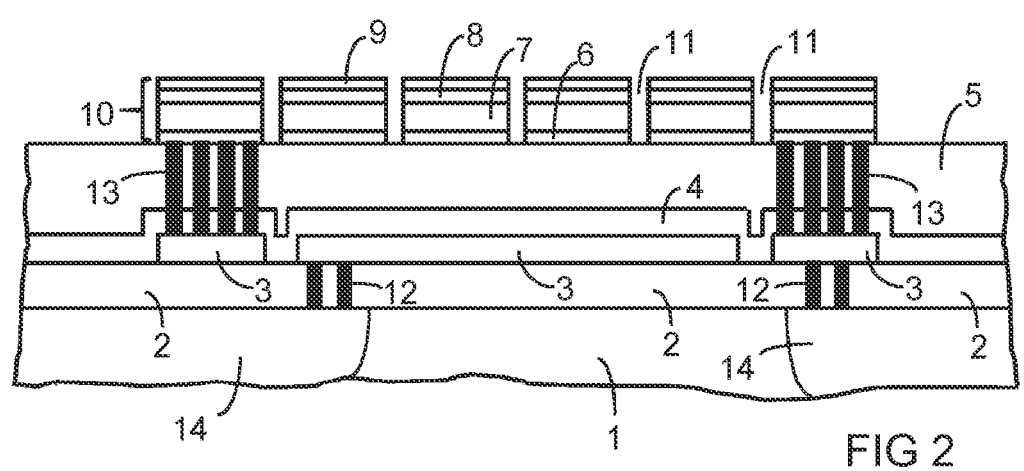
FIG. 2 shows a cross section according to FIG. 1 after the formation of openings in the diaphragm.

FIG. 2 is a cross section according to FIG. 1 after the formation of openings in the diaphragm 10. Elements of the intermediate product shown in FIG. 2 that correspond to elements of the intermediate product shown in FIG. 1 are designated with the same reference numerals. FIG. 2 shows said openings 11 in the diaphragm 10. The openings 11 are provided for a subsequent etching step, wherein an etchant is introduced in the openings 11 to attack and remove the material of the sacrificial layer 5. If HF vapor is employed for etching, the first layer 9 acts as protection layer for the second layer 8 by preventing the production of residues like titanium fluoride in case the etchant attacks the second layer 8.

Figure 3:
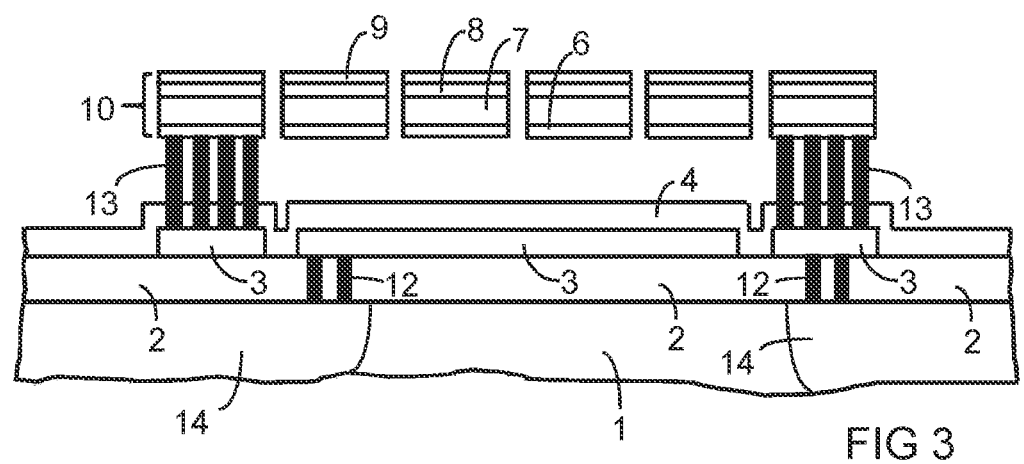
FIG. 3 shows a cross section according to FIG. 2 after release of the diaphragm.

FIG. 3 is a cross section according to FIG. 2 after the removal of the sacrificial layer 5, i.e. the embodiment of FIG. 5 may be regarded as the finalized transducer device. Elements of the intermediate product shown in FIG. 3 that correspond to elements of the intermediate product shown in FIG. 2 are designated with the same reference numerals. The sacrificial layer 5 can completely be removed. Alternatively, residues of the sacrificial layer 5 remain in between the further vias 13. The etching process stops on the etch stop layer 4. FIG. 3 shows the transducer device with the major portion of the diaphragm 10 released, so that the diaphragm 10 is suspended above the semiconductor body 1 and is free to deflect in response to an external cause, in particular when a pressure is applied. The diaphragm 10 may be connected to the semiconductor body 1 only by means of the further vias 13. Alternatively, the diaphragm 10 may be connected to the semiconductor body 1 by means of a clamping structure, for example.

The embodiments shown in the FIGS. 1 to 3 as stated represent exemplary embodiments of the semiconductor transducer device, therefore they do not constitute a complete list of all embodiments according to the improved concept. Actual transducer device configurations may vary from the embodiments shown in terms of shape, size and materials, for example.

The invention claimed is:

1. A semiconductor transducer device comprising:
a semiconductor body; and
a diaphragm having a first layer and a second layer,
wherein a main extension plane of the diaphragm is arranged parallel to a surface of the semiconductor body,
wherein the diaphragm is suspended at a distance from the semiconductor body in a direction perpendicular to the main extension plane of the diaphragm,
wherein the second layer comprises titanium and/or titanium nitride,
wherein the first layer comprises a material that is resistant to an etchant comprising fluorine,
wherein the second layer is arranged between the semiconductor body and the first layer,
wherein the diaphragm further comprises a third layer and a fourth layer,
wherein the third layer is in contact with the second layer,
wherein the third layer is arranged at a smaller distance from the semiconductor body than the second layer,
wherein the fourth layer comprises titanium and/or titanium nitride, and
wherein the fourth layer is arranged at a smaller distance from the semiconductor body than the third layer.

2. The semiconductor transducer device according to claim 1, wherein an etch rate of the first layer is lower than an etch rate of the second layer regarding the etchant.

3. The semiconductor transducer device according to claim 1, wherein the first layer comprises at least one of tungsten, aluminum, aluminum oxide, silicon carbide or silicon-germanium.

4. The semiconductor transducer device according to claim 1, wherein the third layer comprises a metal.

5. The semiconductor transducer device according to claim 1, wherein the semiconductor body further comprises an integrated circuit.

6. The semiconductor transducer device according to claim 1, further comprising:
an electrode layer arranged between the semiconductor body and the diaphragm;
vias interconnecting the electrode layer and the semiconductor body; and
further vias interconnecting the diaphragm and the semiconductor body.

7. The semiconductor transducer device according to claim 6, further comprising a cover layer arranged between the semiconductor body and the electrode layer.

8. The semiconductor transducer device according to claim 1, further comprising an etch stop layer arranged between the semiconductor body and the diaphragm.

9. A pressure sensor comprising:
the semiconductor transducer device according to claim 1.

10. A mobile device comprising:
the pressure sensor according to claim 9.

11. A semiconductor transducer device comprising:
a semiconductor body; and
a diaphragm having a first layer and a second layer,
wherein a main extension plane of the diaphragm is arranged parallel to a surface of the semiconductor body,
wherein the diaphragm is suspended at a distance from the semiconductor body in a direction perpendicular to the main extension plane of the diaphragm,
wherein the second layer comprises titanium and/or titanium nitride,
wherein the first layer comprises a material that is resistant to an etchant comprising a fluorine compound,
wherein the second layer is arranged between the semiconductor body and the first layer,
wherein the diaphragm further comprises a third layer and a fourth layer,
wherein the third layer is in contact with the second layer,
wherein the third layer is arranged at a smaller distance from the semiconductor body than the second layer,
wherein the fourth layer comprises titanium and/or titanium nitride, and
wherein the fourth layer is arranged at a smaller distance from the semiconductor body than the third layer.

12. The semiconductor transducer device according to claim 11, wherein an etch rate of the first layer is lower than an etch rate of the second layer regarding the etchant.

13. The semiconductor transducer device according to claim 11, wherein the first layer comprises at least one of tungsten, aluminum, aluminum oxide, silicon carbide or silicon-germanium.

14. The semiconductor transducer device according to claim 11, wherein the third layer comprises a metal.

15. The semiconductor transducer device according to claim 11, wherein the semiconductor body further comprises an integrated circuit.

16. The semiconductor transducer device according to claim 11, further comprising:
an electrode layer arranged between the semiconductor body and the diaphragm;
vias interconnecting the electrode layer and the semiconductor body; and
further vias interconnecting the diaphragm and the semiconductor body.

17. The semiconductor transducer device according to claim 16, further comprising a cover layer arranged between the semiconductor body and the electrode layer.

18. The semiconductor transducer device according to claim 11, further comprising an etch stop layer arranged between the semiconductor body and the diaphragm.

19. A pressure sensor comprising:
the semiconductor transducer device according to claim 11.

20. A mobile device comprising:
the pressure sensor according to claim 19.

* * * * *